(12) United States Patent
Iwahashi et al.

(10) Patent No.: US 12,235,536 B2
(45) Date of Patent: Feb. 25, 2025

(54) LIQUID CRYSTAL DISPLAY APPARATUS

(71) Applicant: SONY GROUP CORPORATION, Tokyo (JP)

(72) Inventors: Shinji Iwahashi, Tokyo (JP); Teppei Toyoizumi, Tokyo (JP); Kazuyuki Ejima, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 59 days.

(21) Appl. No.: 18/041,667

(22) PCT Filed: Aug. 3, 2021

(86) PCT No.: PCT/JP2021/028857
§ 371 (c)(1),
(2) Date: Feb. 14, 2023

(87) PCT Pub. No.: WO2022/044730
PCT Pub. Date: Mar. 3, 2022

(65) Prior Publication Data
US 2023/0314860 A1    Oct. 5, 2023

(30) Foreign Application Priority Data
Aug. 31, 2020    (JP) ................. 2020-145696

(51) Int. Cl.
*G02F 1/1333*    (2006.01)
*G03B 21/00*    (2006.01)
*G03B 21/16*    (2006.01)

(52) U.S. Cl.
CPC .. *G02F 1/133385* (2013.01); *G02F 1/133308* (2013.01); *G03B 21/00* (2013.01); *G03B 21/16* (2013.01); *G02F 2201/36* (2013.01)

(58) Field of Classification Search
CPC .......... G02F 1/133385; G02F 2201/36; G02F 1/133308; G02F 1/133317; G03B 21/16; H05K 7/20
See application file for complete search history.

(56) References Cited

U.S. PATENT DOCUMENTS

| 2005/0162760 | A1* | 7/2005 | Fujimori | ............. | H04N 9/3141 |
| | | | | | 348/E5.143 |
| 2010/0253865 | A1* | 10/2010 | Yanagisawa | ....... | H05K 7/20981 |
| | | | | | 349/5 |

(Continued)

FOREIGN PATENT DOCUMENTS

| JP | 05-188361 A | 7/1993 |
| JP | 2004-279962 A | 10/2004 |

(Continued)

OTHER PUBLICATIONS

International Search Report and Written Opinion of PCT Application No. PCT/JP2021/028857, issued on Nov. 2, 2021, 09 pages of ISRWO.

*Primary Examiner* — Jessica M Merlin
(74) *Attorney, Agent, or Firm* — CHIP LAW GROUP

(57) ABSTRACT

A liquid crystal display apparatus effectively suppresses a temperature increase in a liquid crystal panel, and includes: a liquid crystal panel; a panel housing configured to accommodate the liquid crystal panel; a first transparent member disposed on a front face side of the liquid crystal panel; and a frame member configured to hold the first transparent member and to be attachable to the panel housing, the frame member defining an interval between the liquid crystal panel and the first transparent member, and forming, between the liquid crystal panel and the first transparent member, a void that allows a coolant to flow along a front face of the liquid crystal panel. The panel housing includes an entrance flow path of the coolant formed at a first part of the panel housing, (Continued)

and an exit flow path of the coolant formed at a second part of the panel housing excluding the first part, and the frame member includes an introduction hole that has one end coupled to the entrance flow path and causes the entrance flow path to be communicated with the void, and a discharge hole that has one end coupled to the exit flow path and causes the exit flow path to be communicated with the void.

14 Claims, 13 Drawing Sheets

(56) References Cited

U.S. PATENT DOCUMENTS

| | | |
|---|---|---|
| 2017/0231121 A1 | 8/2017 | Morton |
| 2020/0218141 A1 | 7/2020 | Van Rafelghem |

FOREIGN PATENT DOCUMENTS

| | | | |
|---|---|---|---|
| JP | 2005-292774 A | 10/2005 | |
| JP | 2006-017799 A | 1/2006 | |
| JP | 3815382 B2 | 8/2006 | |

* cited by examiner

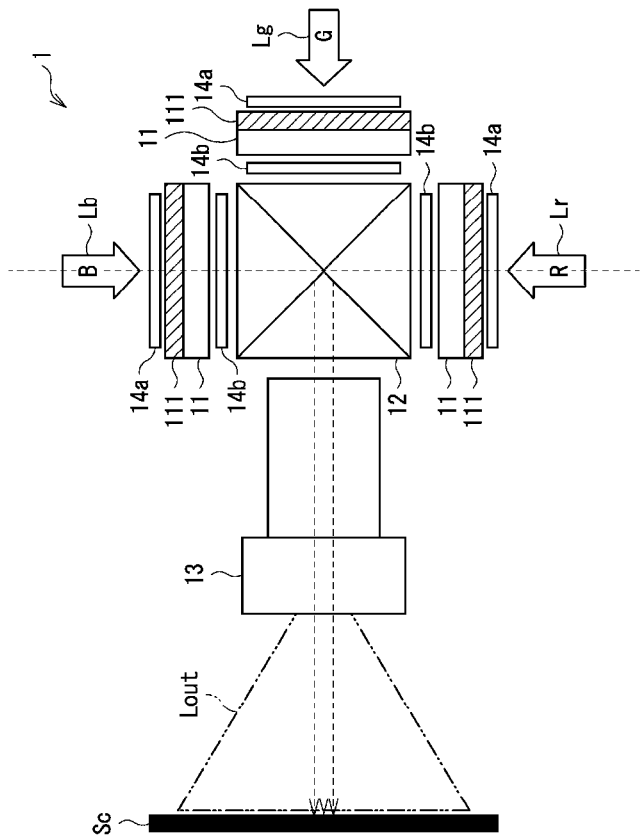
[FIG. 1]

[FIG. 2A]
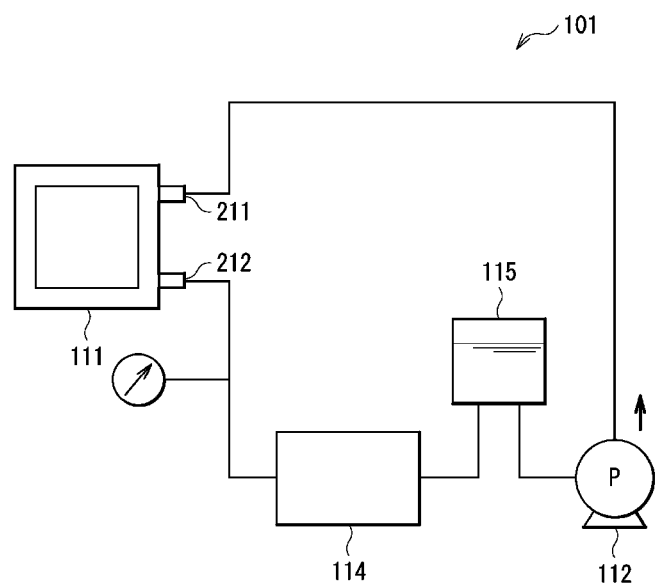

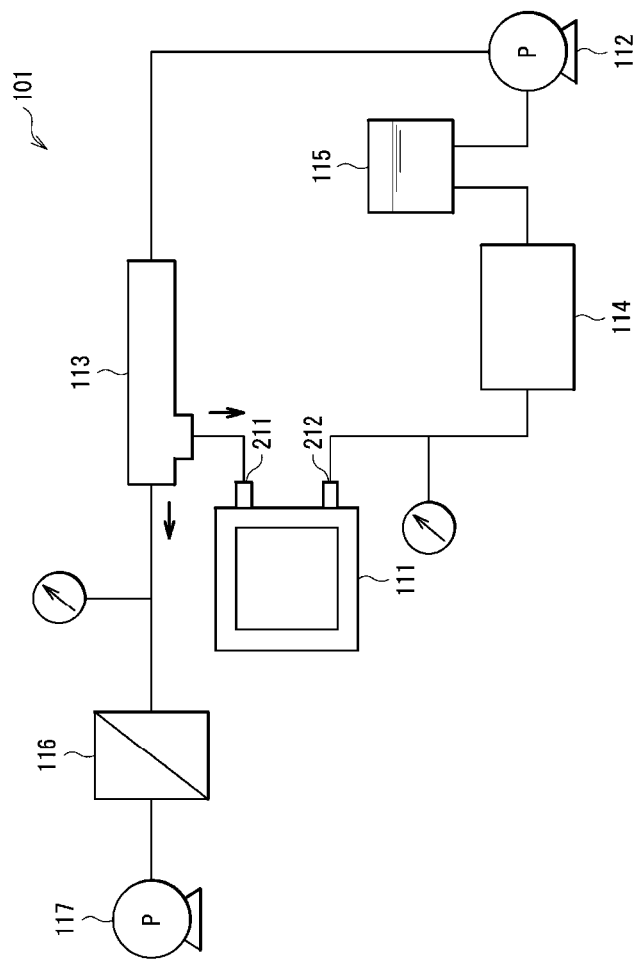
[FIG. 2B]

[FIG. 3]
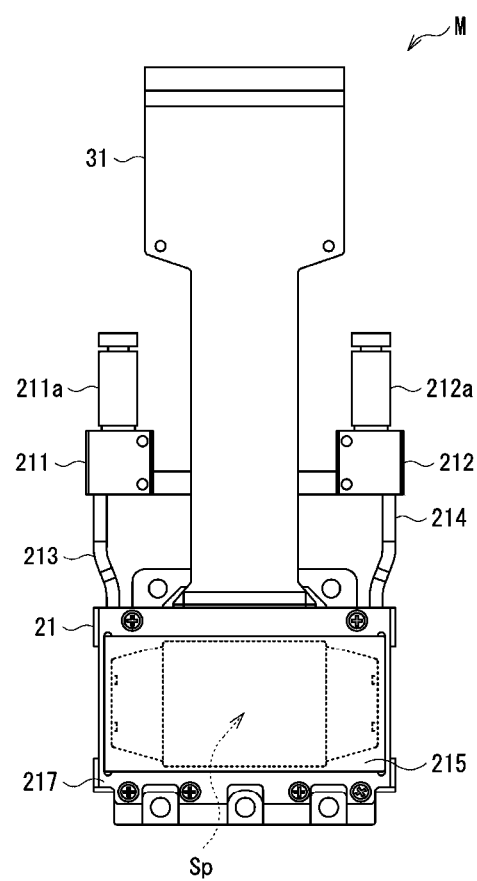

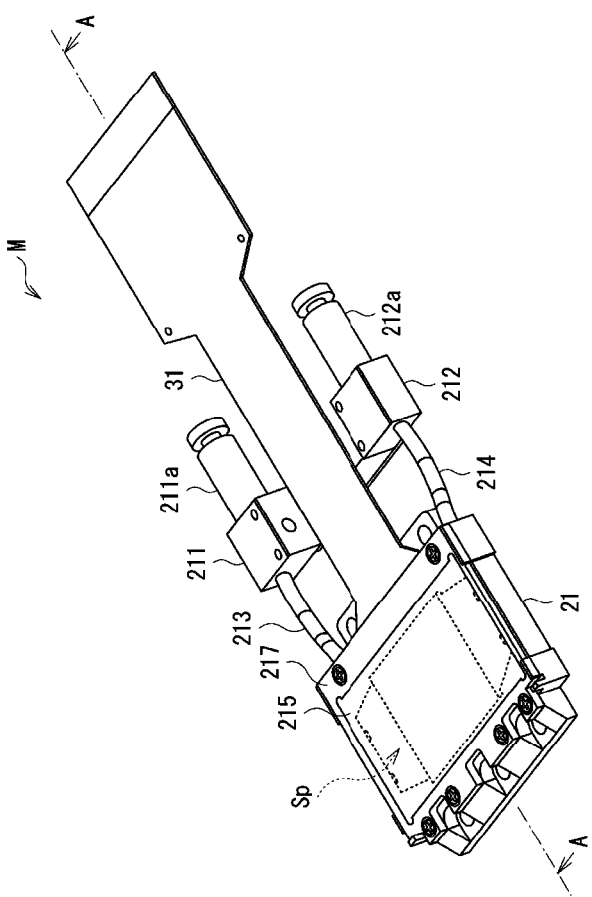
[FIG. 4]

[FIG. 5]
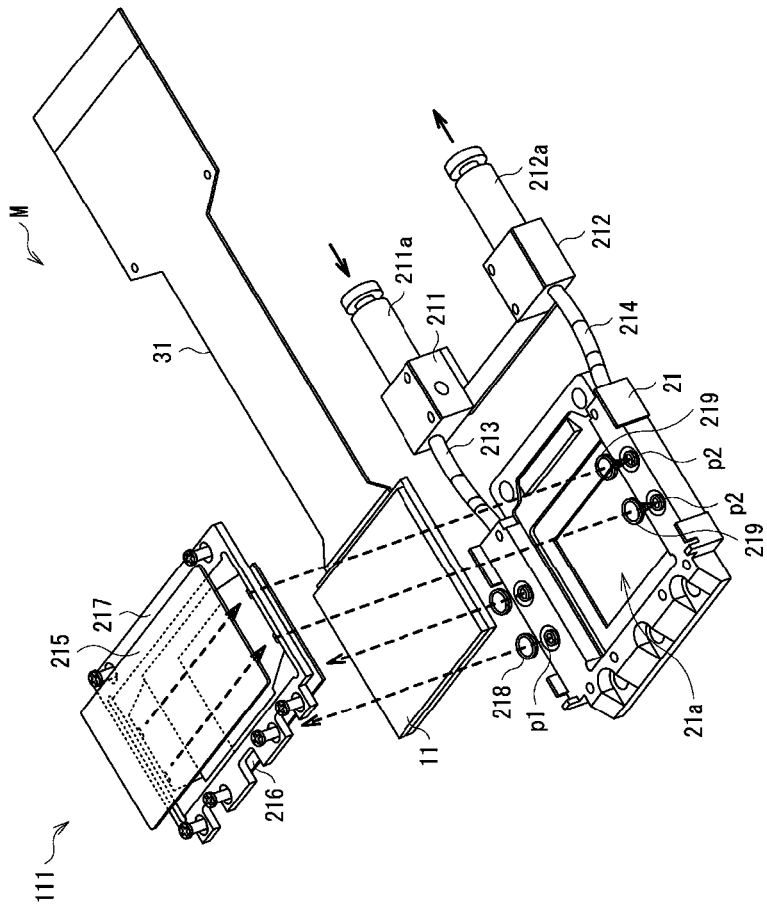

[FIG. 6]
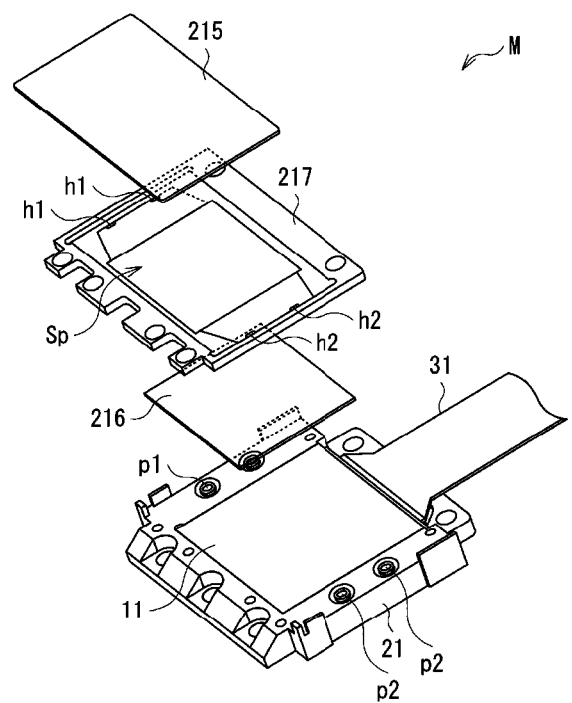

[FIG. 7]
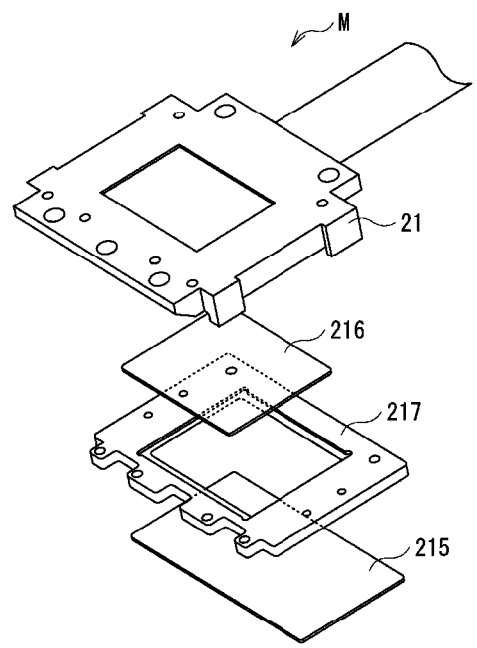

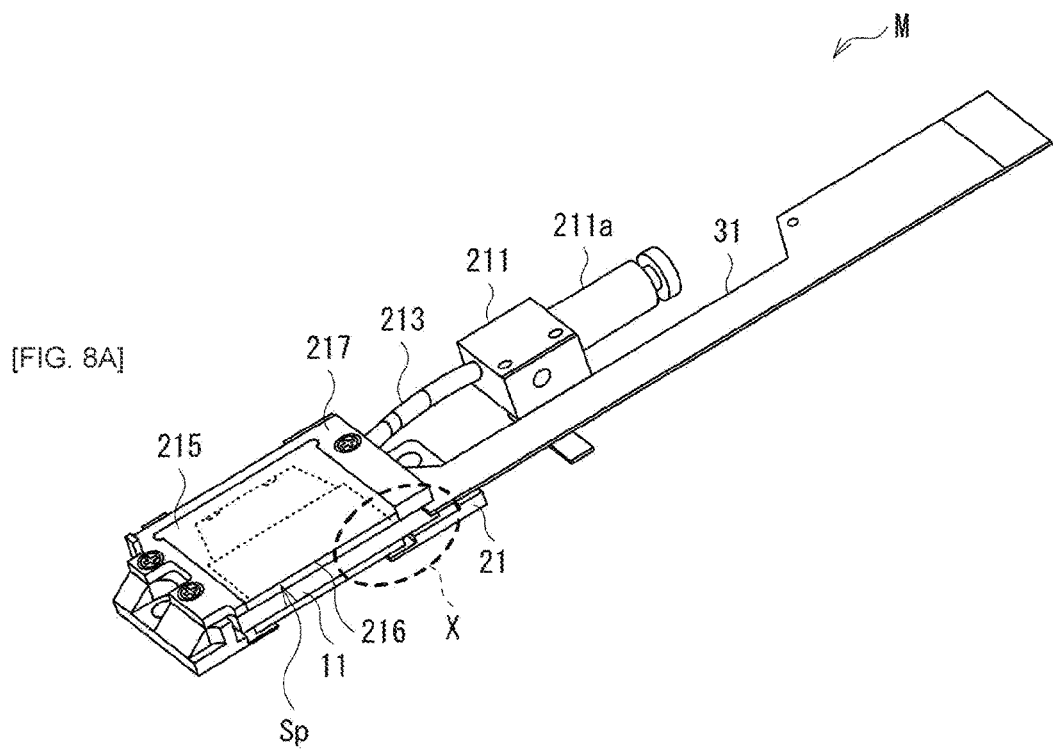
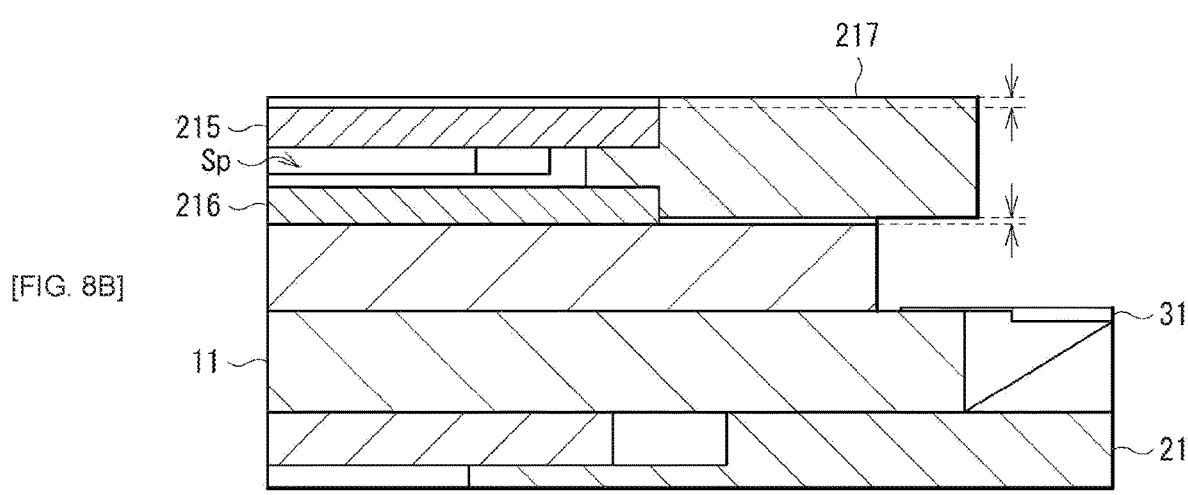

[FIG. 9]
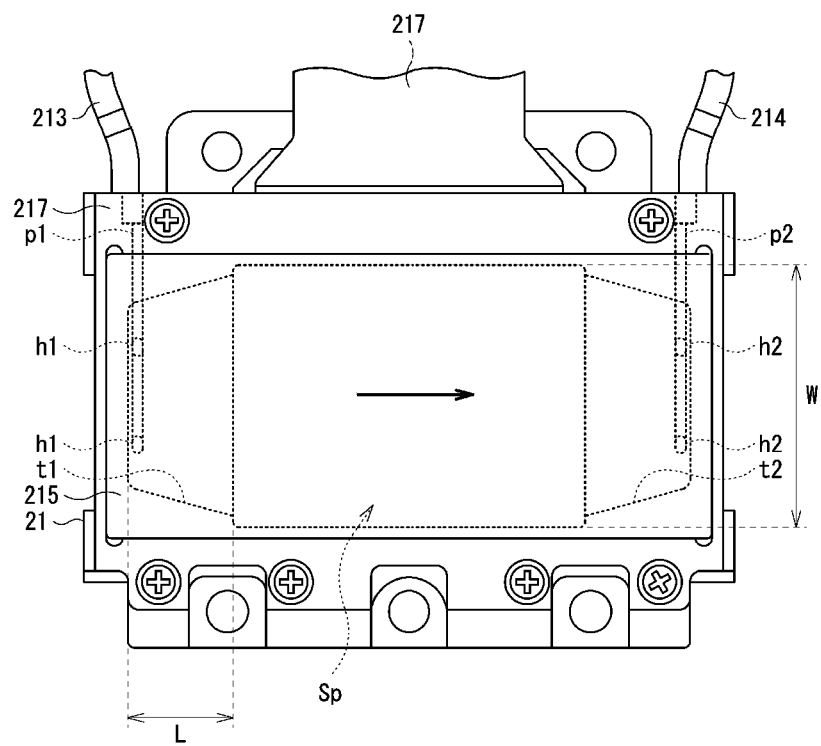

[FIG. 10]
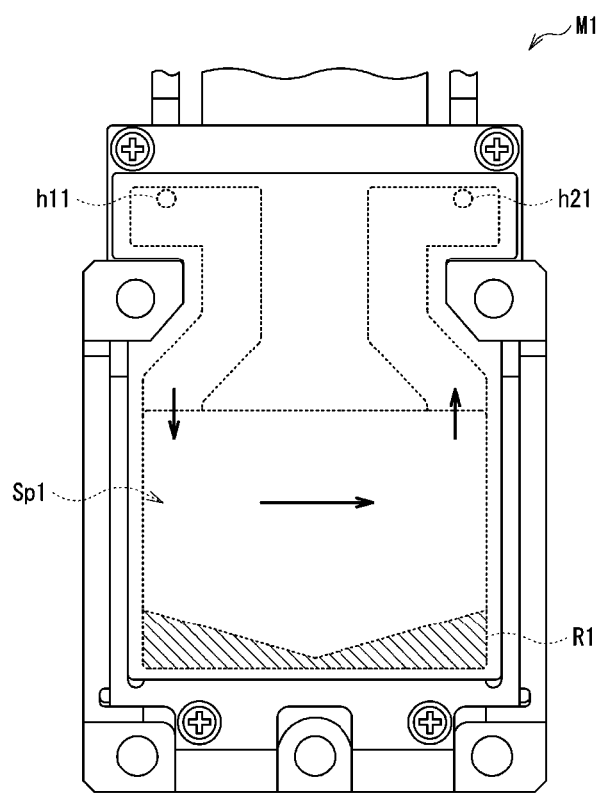

[FIG. 11]
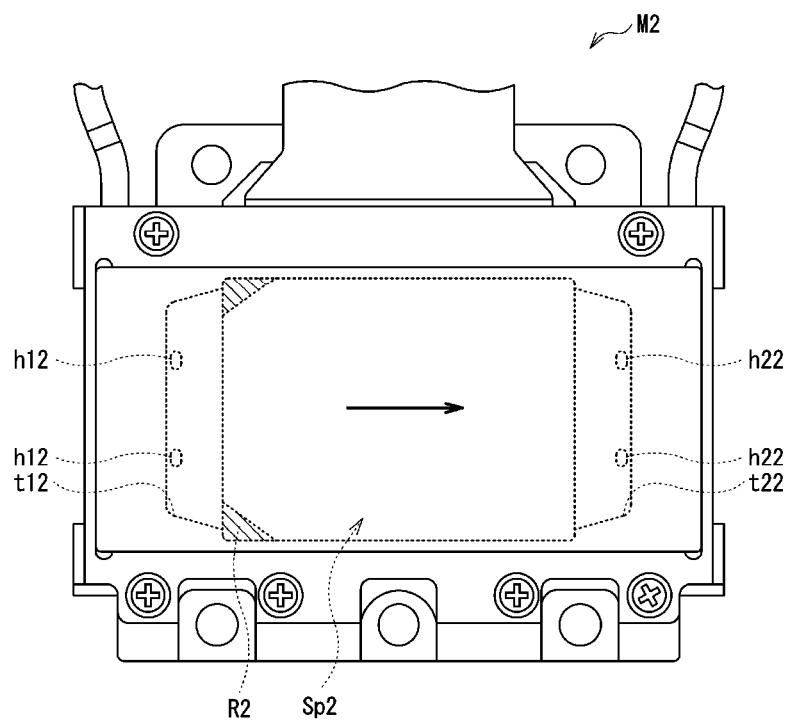

[FIG. 12]
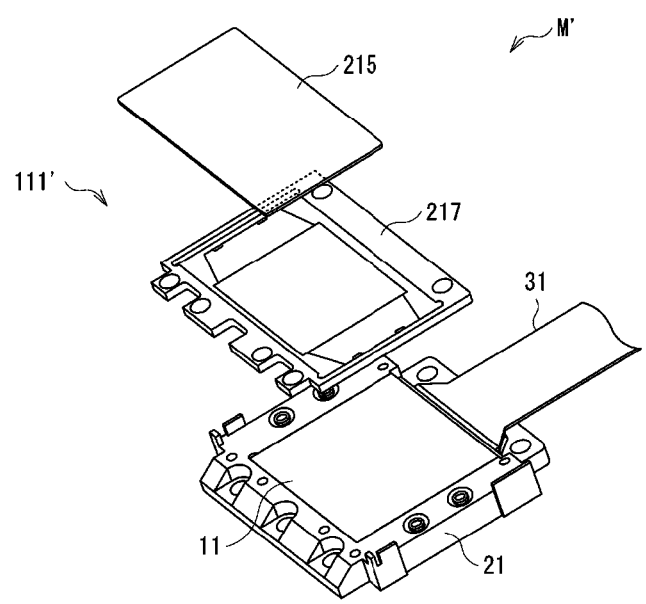

LIQUID CRYSTAL DISPLAY APPARATUS

CROSS REFERENCE TO RELATED APPLICATIONS

This application is a U.S. National Phase of International Patent Application No. PCT/JP2021/028857 filed on Aug. 3, 2021, which claims priority benefit of Japanese Patent Application No. JP 2020-145696 filed in the Japan Patent Office on Aug. 31, 2020. Each of the above-referenced applications is hereby incorporated herein by reference in its entirety.

TECHNICAL FIELD

The present disclosure relates to a liquid crystal display apparatus.

BACKGROUND ART

In order to achieve high luminance and high definition of a liquid crystal display apparatus, a temperature increase of a liquid crystal panel can be problematic. In the liquid crystal display apparatus, the liquid crystal panel functions as a light modulation device. Patent Literature 1 Cdescribes a technique related to liquid cooling of the liquid crystal panel. Specifically, a liquid crystal panel and a transparent dust-proof glass provided on a front face side thereof are bonded to each other by a sealant with a predetermined void being interposed therebetween, and a through hole that allows a coolant to flow therethrough is formed on a portion of the sealant.

CITATION LIST

Patent Literature

Patent Literature 1: Japanese Patent No. 3815382

SUMMARY OF THE INVENTION

In this technique, a coolant is introduced into a void formed between a liquid crystal panel and a dust-proof glass through a through hole provided on a sealant, that is, through a missing portion of the sealant to circulate the coolant, thereby achieving liquid cooling of the liquid crystal panel. However, because a portion of the sealant which should be provided originally is missing, there is a concern in terms of an influence on a sealing property. In addition, in order to ensure a sufficient sealing property by such a configuration, an increase in a size of a structure body is inevitable, making it not possible to be incorporated into an existing liquid crystal display apparatus.

An object of the present disclosure is to provide a liquid crystal display apparatus that makes it possible to effectively suppress a temperature increase of a liquid crystal panel.

A liquid crystal display apparatus according to one embodiment of the present disclosure includes: a liquid crystal panel; a panel housing configured to accommodate the liquid crystal panel; a first transparent member disposed on a front face side of the liquid crystal panel; and a frame member configured to hold the first transparent member and to be attachable to the panel housing. In the present embodiment, the frame member defines an interval between the liquid crystal panel and the first transparent member, and forms, between the liquid crystal panel and the first transparent member, a void that allows a coolant to flow along a front face of the liquid crystal panel. The panel housing includes an entrance flow path of the coolant formed at a first part of the panel housing, and an exit flow path of the coolant formed at a second part of the panel housing excluding the first part, and the frame member includes an introduction hole that has one end coupled to the entrance flow path and causes the entrance flow path to be communicated with the void between the liquid crystal panel and the first transparent member, and a discharge hole that has one end coupled to the exit flow path and causes the exit flow path to be communicated with the void.

BRIEF DESCRIPTION OF THE DRAWINGS

FIG. 1 is a schematic diagram schematically illustrating a configuration of a liquid crystal display apparatus according to an embodiment of the present disclosure.

FIG. 2A is a schematic diagram illustrating an example of an overall configuration of a cooling system of the liquid crystal display apparatus according to the embodiment.

FIG. 2B is a schematic diagram illustrating an overall configuration of the cooling system of the liquid crystal display apparatus according to a modification example of the embodiment.

FIG. 3 is a plan diagram illustrating a liquid crystal panel module of the liquid crystal display apparatus according to the embodiment.

FIG. 4 is a perspective diagram illustrating the liquid crystal panel module of the liquid crystal display apparatus according to the embodiment.

FIG. 5 is an exploded diagram illustrating the liquid crystal panel module of the liquid crystal display apparatus according to the embodiment, and illustrating a flow of a coolant together.

FIG. 6 is an exploded diagram illustrating the liquid crystal panel module of the liquid crystal display apparatus according to the embodiment, and illustrating a relative relationship between a frame member, a front glass, and a rear glass related to liquid cooling of the liquid crystal panel.

FIG. 7 is a diagram illustrating the exploded diagram of FIG. 6 as viewed from a rear side of the liquid crystal panel.

FIG. 8A is a cross-sectional diagram taken along line A-A illustrated in FIG. 4, and FIG. 8B is a partial (X section) enlarged diagram thereof.

FIG. 9 is an enlarged plan diagram illustrating a heat exchanging section of the liquid crystal panel module and schematically illustrating a flow path of cooling water in the heat exchanging section.

FIG. 10 is an explanatory diagram illustrating, as a comparative example, a state in a case where a coolant flows into a void from an upper side with respect to a void and flows out to the upper side.

FIG. 11 is an explanatory diagram illustrating, as a comparative example, a state in a case where a distance from an introduction hole of the coolant to a liquid crystal panel is relatively short.

FIG. 12 is an exploded diagram illustrating a liquid crystal panel module of a liquid crystal display apparatus according to another embodiment of the present disclosure, and illustrating a relative relationship between a frame member and a front glass related to liquid cooling of a liquid crystal panel.

MODES FOR CARRYING OUT THE INVENTION

Embodiments of the present disclosure will be described below with reference to the drawings. The embodiment described below is one specific example of the present disclosure and is not intended to limit a technique of the present disclosure to the following specific embodiments. In addition, arrangement, a size, and a size ratio of each element in the following embodiments are not limited to those illustrated in each drawing.

Description is given in the following order.
1. First Embodiment
1.1. Schematic Configuration of Liquid Crystal Display Apparatus
1.2. Overall Configuration of Cooling System
1.3. Configuration of Liquid Crystal Panel Module
1.4. Workings and Effects
2. Second Embodiment
3. Conclusion

1. First Embodiment

1.1. Schematic Configuration of Liquid Crystal Display Apparatus

FIG. 1 is a schematic diagram schematically illustrating a configuration of a liquid crystal display apparatus 1 according to a first embodiment of the present disclosure.

The liquid crystal display apparatus 1 according to the present embodiment is a transmission type liquid crystal display apparatus, and is, specifically, a transmission type projector that includes a liquid crystal panel 11 as a light modulation device. An example of the applicable liquid crystal panel 11 is a HTPS liquid crystal panel (a high temperature polysilicon TFT liquid crystal panel).

The liquid crystal display apparatus 1 includes an unillustrated light source. The light outputted from the light source is separated into pieces of primary color light Lr, Lg, and Lb having three colors (for example, red, green, and blue) that pass through the liquid crystal panel 11, following which they are synthesized by a dichroic prism 12. The synthesized light is projected onto a screen Sc via a projection lens 13 as image light Lout of a color image.

It is possible to separate the output light by an unillustrated dichroic mirror and an unillustrated reflection mirror. For example, it is made possible by disposing, on a light path of the output light from the light source, a first dichroic mirror that reflects the green light Lg and the blue light Lb and transmits red light Lr, and by disposing, on a light path of reflection light from the first dichroic mirror, a second dichroic mirror that reflects the green light Lg and transmits the blue light Lb.

After the separation, the pieces of primary color light Lr, Lg, and Lb are directed to the liquid crystal panels 11 by a reflection mirror or the like, and receive a light modulation corresponding to image signals of the respective colors by the liquid crystal panels 11, following which they are made to enter the dichroic prism 12. In the light paths of the pieces of primary color light Lr, Lg, and Lb, polarization plates 14a and 14b are disposed before and after the liquid crystal panel 11.

The pieces of primary color light Lr, Lg, and Lb having been subjected to the light modulation are synthesized by the dichroic prism 12. In the present embodiment, the dichroic prism 12 is configured by combining four right-angle prisms, and a dielectric multilayer film that reflects the red light Lr and a dielectric multilayer film that reflects the blue light Lb are formed in a cross shape on an inner surface.

The light following the synthesis by the dichroic prism 12 is enlarged by the projection lens 13, and the enlarged light is projected onto the screen Sc as the image light Lout. This displays the color image on the screen Sc.

In the present embodiment, a cooling system 101 configured to circulate a coolant is provided for a purpose of cooling the liquid crystal panel 11. The cooling system 101 includes, as its main component, a heat exchanging section 111 that cools the liquid crystal panel 11 by a heat exchange with the coolant. The coolant is a so-called antifreeze, and retains a viscosity of a level that makes it possible to ensure a sufficient fluidity, over the entire operating temperature of the liquid crystal display apparatus 1. Here, the heat exchanging section 111 is disposed on a front face side (an entrance side of light) of the liquid crystal panel 11 as an embodiment, but the arrangement of the heat exchanging section 11 is not limited thereto. It is possible to dispose the heat exchanging section 11 on a rear face side (an output side of light) of liquid crystal panel 11, or on both the front face side and the rear face side. In the present embodiment, the liquid crystal panel 11 and the heat exchanging section 111 of the cooling system 101 are further coupled together to form a liquid crystal panel module M, and the heat exchanging section 111 is disposed between the liquid crystal panel 11 and the polarization plate 14a provided on the front face side thereof.

1.2. Overall Configuration of Cooling System

FIG. 2A illustrates an example of an overall configuration of the cooling system 101 of the liquid crystal display apparatus 1 according to the present embodiment, and FIG. 2B illustrates an overall configuration of the cooling system 101 of the liquid crystal display apparatus 1 according to a modification example of the present embodiment.

The cooling system 101 basically includes a feed pump 112, a radiator 114, and a buffer tank 115, in addition to the heat exchanging section 111. In addition, in a case where a deaeration filter 113 is provided, the cooling system 101 includes, in addition to the above, the deaeration filter 113, a trap 116, and a vacuum pump 117.

Upon activation of the cooling system 101, the feed pump 112 is driven. The coolant stored in the buffer tank 115 is pumped by the feed pump 112, which is then pressure fed through a pipe on a feed side toward the heat exchanging section 111. In a case where the deaeration filter 113 is provided, the vacuum pump 117 is driven on an as-necessary basis, and the coolant outputted from the feed pump 112 passes through the deaeration filter 113 on the way to the heat exchanging section 111 and a bubble component is removed by the deaeration filter 113. As the applicable deaeration filter 113, it is possible to exemplify a deaeration filter module "SEPAREL" (Registered trademark) manufactured by DIC Co., Ltd. The deaeration filter 113 includes a filtering element configured by a plurality of hollow fibers. The plurality of hollow fibers is arranged parallel or in a direction perpendicular to a flow direction of the coolant. By reducing a pressure inside the hollow fibers and allowing the coolant to flow around the hollow fibers by the vacuum pump 117, it is possible to cause the bubble component included in the coolant, such as oxygen or nitrogen, to be taken into the hollow fibers and to separate it from the coolant. It is possible to capture and collect the bubble component following the separation by the trap 116 provided on an upstream side of the vacuum pump 117. During the activation of the cooling system 101, it is possible to monitor the bubbles included in the coolant, and to stop the vacuum pump 117 in a case where the bubbles are sufficiently reduced.

After passing through the heat exchanging section 111, the coolant is pressure fed through a pipe on a discharge side toward the buffer tank 115 and is collected by the buffer tank 115 via the radiator 114. The radiator 114 dissipates a heat which the coolant has received by the heat exchange with the liquid crystal panel 11 by a heat exchange with air.

1.3. Configuration of Liquid Crystal Panel Module

FIG. 3 is a plan diagram illustrating the liquid crystal panel module M of the liquid crystal display apparatus 1 according to the present embodiment, and FIG. 4 is a perspective diagram illustrating the liquid crystal panel module M.

FIGS. 5 to 7 are each an exploded diagram illustrating the liquid crystal panel module M, in which FIG. 5 schematically illustrates, by a dotted line, a flow of the coolant in the liquid crystal panel module M. FIG. 6 illustrates a relative relationship of a main configuration related to liquid cooling of the liquid crystal panel, specifically, a relative relationship between a front glass 215, a rear glass 216, and a frame member 217, with the liquid crystal panel 11 being contained in the panel housing 21. Further, FIG. 7 illustrates the exploded diagram of FIG. 6 as viewed from a rear side of the liquid crystal panel 11 (i.e., from the output side of light).

FIG. 8A is a cross-sectional diagram taken along line A-A illustrated in FIG. 4, and FIG. 8B is a partial (X section) enlarged diagram thereof.

FIG. 9 is an enlarged plan diagram illustrating the heat exchanging section 111 of the liquid crystal panel module M, and schematically illustrating a flow path of cooling water in the heat exchanging section 111.

Referring to FIGS. 3, 4, 5, 6, 7, 8A, 8B, and 9 on an as-necessary basis, a configuration and a basic operation of the liquid crystal display apparatus 1 will be described.

As illustrated in FIG. 5, the liquid crystal panel module M, when broadly classified, includes the liquid crystal panel 11, the panel housing 21, a printed circuit board 31, and various elements related to the liquid cooling of the liquid crystal panel 11.

As already described previously, the liquid crystal panel 11 functions as the light modulation device.

The panel housing 21 accommodates the liquid crystal panel 11, and serves as a frame body upon installing the liquid crystal panel 11 on the liquid crystal display apparatus 1. The panel housing 21 has a recessed section 21a in which an opening of a size that allows for passing of the pieces of primary color light Lr, Lg, and Lb that has transmitted through the liquid crystal panel 11, i.e., the pieces of primary color light Lr, Lg, and Lb having been subjected to the modulation by the liquid crystal panel 11 is formed, and the liquid crystal panel 11 is accommodated in the recessed section 21a. FIG. 6 illustrates a state in which the liquid crystal panel 11 is accommodated in the recessed section 21a. The pieces of primary color light Lr, Lg, and Lb are transmitted through the liquid crystal panel 11 from its front face toward the rear face and pass through the liquid crystal panel module M through the opening of the recessed section 21a.

The printed circuit board 31 is coupled to a terminal section formed on the liquid crystal panel 11, and applies an operating voltage of liquid crystals to the liquid crystal panel 11.

The cooling of the liquid crystal panel 11 is performed by the coolant that circulates through the cooling system 101. The liquid crystal panel module M includes a feed joint (sometimes referred to as a feed manifold) 211 configured to be coupled to a pipe on a feed side and a discharge joint (sometimes referred to as a discharge manifold) 212 configured to be coupled to a pipe on a discharge side or a return side. The feed joint 211 includes a connection section 211a to which a tube member of a feed pipe is coupled, and the discharge joint 212 includes a connection section 212a to which a tube member of a discharge pipe is coupled. The feed joint 211 configures a "first joint" according to the present embodiment, and the discharge joint 212 configures a "second joint" according to the present embodiment.

Both the feed joint 211 and the discharge joint 212 are disposed away from the panel housing 21, and are coupled to a flow path of the coolant formed at the panel housing 21 via the feed pipe 213 and the discharge pipe 214. The feed pipe 213 configures a "first connection pipe" according to the present embodiment, and the discharge pipe 214 configures a "second connection pipe" according to the present embodiment.

In this way, in the present embodiment, the feed and the discharge of the coolant relative to the heat exchanging section 111 of the liquid crystal panel module M are achieved via the feed joint 211, the feed pipe 213, the discharge joint 212, and the discharge pipe 214. This configuration allows the panel housing 21 to be thin in size and allows the heat exchanging section 111 to be disposed between the polarization plate 14a and the liquid crystal panel 11.

For a liquid crystal panel module body configured by accommodating the liquid crystal panel 11 in the panel housing 21, the heat exchanging section 111 of the liquid crystal panel module M is configured as an assembly of the front glass 215, the rear glass 216, and the frame member 217, and is disposed on the front face side of the liquid crystal panel 11.

Both the front glass 215 and the rear glass 216 have a flat and thin rectangular shape, and have a transparency enough to suppress an optical loss when the pieces of primary color light Lr, Lg, and Lb are transmitted. It is possible to exemplify a fused quartz as a material applicable as the front glass 215 and the rear glass 216. In addition to the fused quartz, it is possible to exemplify a synthetic quartz, a glass, and a crystal, and it is also possible to exemplify a spinel (a spinel) and a sapphire as those in which a higher thermal conductivity is expectable. The spinel and the sapphire are particularly suitable as a material of the rear glass 216 material because they are excellent not only in transparency but also in thermal conductivity.

In the present embodiment, the front glass 215 has a long shape in which one side is longer than the other side perpendicular thereto, and a flow direction of the coolant is set in a direction parallel to the one side (i.e., a longitudinal direction). In contrast, a size in a direction parallel to the longitudinal direction of the front glass 215 of the rear glass 216 is smaller than a size of the front glass 215. The front glass 215 corresponds to a "first transparent member" according to the present embodiment, and the rear glass 216 corresponds to a "second transparent member" according to the present embodiment.

The frame member 217 has an opening of a size through which the pieces of primary color light Lr, Lg, and Lb that are to be subjected to the light modulation by the liquid crystal panel 11 (i.e., before the modulation by the liquid crystal panel 11) are able to pass, and the front glass 215 and the rear glass 216 are bonded to a frame section that forms the opening. The front glass 215 is bonded to an end face on a front side of the frame section of the frame member 217, and the rear glass 216 is bonded to an end face on a back side of the frame section of the frame member 217. Here, the "front side" with respect to the frame member 217 may be referred to as a distal side with respect to the liquid crystal panel 11, and the "back side" may be referred to as a proximal side with respect to the liquid crystal panel 11. The frame member 217 corresponds to a "frame member" according to the present embodiment. It is possible to exemplify aluminum as a material employable as the frame member 217.

As also illustrated in FIG. 6, a void Sp having a depth corresponding to a thickness of the frame member 217 is formed between the front glass 215 and the rear glass 216 with the front glass 215 and the rear glass 216 being bonded to the frame member 217. A flow path of the cooling water in the heat exchanging section 111 is formed by the void Sp. The coolant flows through the flow path formed by the void Sp in a direction parallel to the front face of the liquid crystal panel 11 (FIG. 5).

The frame member 217 has an introduction hole h1 for introducing the coolant supplied via the feed joint 211 into the void Sp, and a discharge hole h2 for discharging the coolant discharged via the discharge joint 212 from the void Sp. Both the introduction hole h1 and the discharge hole h2 are formed to penetrate through the frame member 217 in a thickness direction thereof, and form an opening that faces in a direction perpendicular to the flow direction of the coolant in the void Sp with respect to the void Sp.

As best seen in FIG. 6, out of the frame section, the frame member 217 has a step at a part positioned at the front and the back of the opening with respect to the flow direction of the cooling water in the void Sp, and the step allows that part to have a recessed shape, which forms a space that is continuous to the front and the back of the opening with respect to the opening. The space formed by the step forms the void Sp together with the opening and forms the flow path of the coolant in the heat exchanging section 111. The introduction hole h1 and the discharge hole h2 penetrate through a bottom section of the step in a thickness direction of the frame member 217.

As illustrated in FIG. 9, the space before the opening and the after the opening formed by the step has a reverse-tapered shape in which a width increases as approaching the opening from the introduction hole h1, i.e., as approaching an effective screen region of the liquid crystal panel 11 from the introduction hole h1, and has a forward-tapered shape in which the width decreases as approaching the discharge hole h2 from the opening. This promotes the coolant introduced from the introduction hole h1 to the void Sp to spread in a width of the void Sp as a whole, thereby achieving the cooling of the liquid crystal panel 11 throughout the entire effective screen region thereof. This also promotes the coolant having passed through the opening to flow toward the discharge hole h2, thereby achieving the discharge from the void Sp smoothly. FIG. 9 illustrates a widened section t1 before the opening that forms the reverse-tapered shape, and a narrowed section t2 after the opening that forms the forward-tapered shape. The widened section t1 corresponds to a "widened section" according to the present embodiment.

It becomes possible to more smoothly perform the introduction and the discharge of the coolant not only by varying the width of the flow path of the widened section t1 and the narrowed section t2 but also by varying a depth. For example, a bottom surface of the widened section t1 may be provided with an inclination that goes downward in the flow direction, or the bottom surface of the narrowed section t2 may be provided with an inclination that goes upward in the flow direction.

As a length L of the widened section t1, it is possible to exemplify the length L that is in a range of $\frac{1}{3}$ to $\frac{1}{2}$ of the width of the opening of the frame member 217, i.e., a width W of the effective screen region of the liquid crystal panel 11 perpendicular to the flow direction of the coolant in the void Sp. The length of the widened section t1 which is within such a range makes it possible to ensure a distance necessary for promoting such that the coolant introduced into the void Sp spreads across the entire width of the void Sp.

Still referring to FIG. 9, in the present embodiment, the panel housing 21 is formed with an entrance flow path p1 of the coolant and an exit flow path p2 of the coolant. The inside of the feed joint 211 and the introduction hole h1 of the frame member 217 communicate with each other via the entrance flow path p1, and the inside of the discharge joint 212 and the discharge hole h2 of the frame member 217 communicate with each other via the exit flow path p2. FIG. 9 schematically illustrates a positional relationship between the feed pipe 213, the entrance flow path p1, and the introduction hole h1, and schematically illustrates a positional relationship between the discharge pipe 214, the exit flow path p2, and the discharge hole h2. The entrance flow path p1 communicates at one end with the inside of the feed joint 211 via the feed pipe 213, and communicates at the other end with the introduction hole h1. The exit flow path p2 communicates at one end with the inside of the discharge joint 212 via the discharge pipe 214, and communicates at the other end with the discharge hole h2. It is possible to form the entrance flow path p1 and the exit flow path p2 in the form of a bore on the panel housing 21 and to form them in the form of a groove as well.

In the present embodiment, furthermore, the panel housing 21 and the frame member 217, specifically, a front face of the frame section of the panel housing 21 and a rear face of the frame section of the frame member 217, are coupled to each other while they are in contact with each other. In a state after the coupling, the introduction hole h1 of the frame member 217 is disposed coaxially with the opening on the exit side of the entrance flow path p1, and the discharge hole h2 of the frame member 217 is disposed coaxially with the opening on the entrance side of the exit flow path p2. In the panel housing 21, on the front face of the frame section, an annular groove is formed so as to surround the opening on the exit side of the entrance flow path p1 over the entire circumference thereof, and an annular groove is formed so as to surround opening on the entrance side of the exit flow path p2 over the entire circumference thereof, and O-rings 218 and 219 are provided on the respective grooves (FIG. 5). By tightening the frame member 217 to the panel housing 21, the O-rings 218 and 219 are compressed between the frame member 217 and the panel housing 21, and connection ends of the entrance flow path p1 and the introduction hole h1 are liquid-tightly sealed, and connection ends of the exit flow path p2 and the discharge hole h2 are liquid-tightly sealed. The tightening of the frame member 217 against the panel housing 21 is by a fixing member such as a screw, for example. The O-ring 218 provided on the introduction hole h1 side corresponds to a "first sealing member" according to the present embodiment, and the O-ring 219 provided on the discharge hole h2 side corresponds to a "second sealing member" according to the present embodiment.

As illustrated in FIGS. 8A and 8B, in a state after the coupling of the panel housing 21 and the frame member 217, the rear glass 216 is in contact with the front face of the liquid crystal panel 11 throughout the rear face thereof. Here, the rear face of the rear glass 216 may have the smaller area than the front face of the liquid crystal panel 11, but preferably has the area of the front face of the liquid crystal panel 11 sufficient to surround the effective screen region in a planar direction. The effective screen region of the liquid crystal panel 11 refers to a region of the front face of the liquid crystal panel 11 that substantially contributes to the light modulation of the incident light (in the present embodiment, the pieces of primary color light Lr, Lg, and Lb). The rear glass 216 is bonded over the entire rear face by an adhesive with the rear face thereof being in contact with the front face of the liquid crystal panel 11.

In the present embodiment, in a state after the coupling, the front face of the front glass 215, i.e., the distal face facing the light path side of the front glass 215, is disposed closer to the liquid crystal panel 11 than the end face facing the light path side of the frame section of the frame member 217. This allows the front glass 215 to be protected from an external contact. FIG. 8B illustrates the step of the front face of the front glass 215 with respect to the end face on the light path side of the frame section of the frame member 217 by a size D1. On the other hand, the rear face of the rear glass 216, in other words, the side opposite to the light path of the rear glass 216, i.e., the proximal face facing in a direction of the liquid crystal panel 11, is disposed closer to the liquid crystal panel 11 than the end face facing the opposite side of the light path of the frame section of the frame member 217. Accordingly, upon the bonding of the rear glass 216 and the liquid crystal panel 11, it is possible to increase adherence between the rear glass 216 and the liquid crystal panel 11, and improve a cooling efficiency. Further, the excessive residual adhesive remaining between the rear glass 216 and the liquid crystal panel 11 not only makes it possible to reduce the cooling efficiency but also makes it possible to suppress an influence on a transparency of light. FIG. 8B illustrates the step of the rear face of the rear glass 216 with respect to the end face on the opposite side of the light path of the frame section of the frame member 217 by a size D2.

Of the frame member 217, the end face facing the light path corresponds to a "first end face" according to the present embodiment, and the end face facing on the opposite side of the light path corresponds to a "second end face" according to the present embodiment.

FIGS. 8A and 8B schematically illustrate together a terminal section of the printed circuit board 31, i.e., the connection section with respect to the liquid crystal panel 11.

In the present embodiment, the terminal section of the printed circuit board 31 is provided between the introduction hole h1 and the discharge hole h2 in the flow direction of the coolant in the void Sp. Further, the printed circuit board 31 is drawn from the terminal section through the feed joint 211 and the feed connection pipe 213 and through the discharge joint 212 and the discharge connection pipe 214 in a direction perpendicular to the flow direction of the coolant. In this way, a drawing direction of the printed circuit board 31 from the terminal section is perpendicular to the flow direction of the coolant in the void Sp.

1.4. Workings and Effects

A temperature increase of a liquid crystal panel can be problematic for achieving a high luminance and a high definition of a liquid crystal display apparatus. The above-described Patent Literature 1 discloses a technique related to liquid cooling of the liquid crystal panel, and teaches that the liquid crystal panel and a transparent dust-proof glass provided on the front face side are joined to each other by a sealant with a predetermined void interposed therebetween, and a through hole through which the coolant is allowed to flow is formed on a portion of the sealant. However, in this technique, a coolant is introduced into a void formed between the liquid crystal panel and the dust-proof glass through a through hole provided on the sealant, i.e., through a missing portion of the sealant, to thereby circulate the coolant through the void so as to achieve the liquid cooling of the liquid crystal panel. Accordingly, the technique has a concern in terms of an influence on a sealing property, because a portion of the sealant which should be originally provided is missing. In addition, in order to ensure a sufficient sealing property by such a configuration, an increase in a size of a structure body is inevitable and it has not been possible to incorporate it into an existing liquid crystal display apparatus.

In contrast, in the present embodiment, with respect to the panel housing 21 in which the liquid crystal panel 11 is accommodated, the frame member 217 formed with the opening that allows the effective screen region of the liquid crystal panel 11 to be exposed is attached on the front face side of the liquid crystal panel 11. The front glass 215 is held by the frame member 217 while covering the front face of the liquid crystal panel 11 in a state of being separated away from the liquid crystal panel 11 at a predetermined interval. The void Sp that allows the coolant to flow along the front face of the liquid crystal panel 11 is formed between the liquid crystal panel 11 and the front glass 215. In addition, the introduction path and the discharge path of the coolant that penetrate through the panel housing 21 and the frame member 217 and coupled to the void Sp are formed, and the coolant is circulated to the void Sp through the introduction path and the discharge path.

This allows the liquid crystal panel 11 to be maintained at a temperature equal to or below an operating limit temperature thereof by effectively suppressing the temperature increase of the liquid crystal panel 11 by the liquid cooling, thereby further achieving higher luminance and higher definition of the liquid crystal panel 11 and the liquid crystal display apparatus 1, and thereby makes it possible to form a brighter, finer image.

In the present embodiment, the introduction path of the coolant is formed by the entrance flow path p1 of the panel housing 21 and the introduction hole h1 of the frame member 217, and the discharge path of the coolant is formed by the exit flow path p2 of the panel housing 21 and the discharge hole h2 of the frame member 217, thereby making it possible to circulate the coolant in the liquid crystal panel module M without relying on a flow path member such as a pipe. This allows the heat exchanging section 111 to be thin and compact in configuration, reducing the occupied volume necessary to install the heat exchanging section 111 and making it possible to incorporate the heat exchanging section 111 into a relatively tight, narrow space between the liquid crystal panel 11 and the polarization plate 14a. This contributes to thinning and compactification of the liquid crystal panel module M as a whole.

Further, the rear glass 216 is employed in addition to the front glass 215, and the void Sp that serves as a flow path of the coolant is formed between the front glass 215 and the rear glass 216, which makes it possible to easily secure the liquid-tightness of the heat exchanging section 111, to increase the reliability of the heat exchanging section 111 or the liquid crystal panel module M, and to reduce the installation costs.

In the present embodiment, as illustrated in FIG. 9, the open ends of the introduction hole h1 and the discharge hole h2 each face in a direction perpendicular to the flow direction of the coolant in the void Sp, and the flow path from the introduction hole h1 to the discharge hole h2 via the opening is formed linearly in the longitudinal direction of the front glass 215, making it possible to smoothly flow the coolant throughout the void Sp as a whole and to suppress an occurrence of retention of the flow of the coolant. As a result, it is possible to suppress an occurrence of a thermal unevenness or the like in the coolant flowing through the void Sp and an occurrence of a deterioration in quality (for example, unevenness in brightness of an image) of an image on the screen Sc.

Here, in the present embodiment, forming the widened section t1 and the narrowed section t2 before and after the opening related to the flow direction of the coolant makes it possible to smoothly widen the flow of the coolant introduced into the void Sp and to smoothly narrow the flow of the coolant after having passed through the opening. This makes it possible to cause the introduction and the discharge of the coolant with respect to the void Sp to be smoother and to more effectively suppress the occurrence of the retention in the flow of the coolant.

FIG. 10 is an explanatory diagram illustrating a state in a case where the coolant flows from an upper side to the void Sp1 (the liquid crystal panel 11) and flows out to the upper side as a first comparative example of the present embodiment.

In the first comparative example, a flow direction of the coolant that goes toward the opening from the introduction hole h11 and a flow direction of the coolant that goes toward the discharge hole h2 from the opening are each in a flow direction of the coolant in the opening, i.e., are each perpendicular to the flow direction in the void Sp1 substantially, and the flow path from the introduction hole h11 to the discharge hole h21 via the opening is not in a linear state. As a result, the flow of the coolant in the void Sp tends to be biased at a portion of the opening, and the retention of the flow tends to occur easily in a region R1 in the vicinity of the lower side. When the retention occurs in the flow, not only a thermal unevenness occurs but also bubbles included in the coolant concentrate and stagnate, so that an influence on the quality of images is significant.

In the present embodiment, the widened section t1 continuous to the opening is formed, and the length L of the widened section t1 is the length L in a range of ⅓ to ½ of the width W of the opening of the frame member 217 to ensure a distance necessary for the flow of the coolant to spread from the introduction hole h1 to the opening, thereby making it possible to more effectively suppress the occurrence of the retention of the flow of the coolant.

FIG. 11 is an explanatory diagram illustrating a state in a case where the distance from the introduction hole h12 to the opening is relatively short as a second comparative example of the present embodiment.

In the second comparative example, the distance from the introduction hole h1 to the opening is short, and it reaches the opening before the flow of the coolant spreads sufficiently. Accordingly, the retention tends to occur easily in the flow of the coolant in a region R2 in the vicinity of a boundary between the widened section t11 and the opening.

2. Second Embodiment

FIG. 12 is an exploded diagram illustrating a liquid crystal panel module M' of the liquid crystal display apparatus 1 according to a second embodiment of the present disclosure, and illustrating a relative relationship between the front glass 215 and the frame member 217 related to liquid cooling of the liquid crystal panel 11.

In the first embodiment described above, as a member that blocks the opening of the frame member 217, the rear glass 216 is employed in addition to the front glass 215, and a configuration is employed in which the opening is blocked by, with respect to the frame member 217, both the front face thereof and the light path side and the opposite side thereof.

In contrast, in the present embodiment, out of the two front and rear glasses 215 and 216, the rear glass 216 is removed, and a void that serves as a flow path of the coolant is formed between the liquid crystal panel 11 and the front glass 215. In addition, the opening of the frame member 217 is blocked from the front face side by the front glass 215, while on the rear side opposite thereto, the opening of the frame member 217 is blocked from the rear side by the liquid crystal panel 11.

According to the present embodiment, by eliminating the rear glass 216, it is possible to achieve the liquid crystal panel module M' and the heat exchanging section thereof with a smaller number of components, which is advantageous mainly in terms of introduction costs. In addition, the elimination of the rear glass 216 reduces a thermal resistivity and thus improves a cooling performance of the liquid crystal panel 11 as well.

3. Conclusion

Embodiments of the present disclosure have been described above with reference to the drawings. According to the embodiments of the present disclosure, it is possible to effectively suppress the temperature increase of the liquid crystal panel and to achieve even higher luminance and even higher definition of the liquid crystal panel and the liquid crystal display apparatus, and thereby makes it possible to form a brighter and more detailed image.

A technique of the present disclosure is not limited to the specific embodiments described above, and various modifications are possible, and a combination of modification examples is also possible.

Further, not all of the configurations and operations described in the respective embodiments are essential to the configuration and the operation of the present disclosure. For example, among the elements in the respective embodiments, elements not recited in an independent claim based on the most generic concept of the present disclosure are to be understood as optional components.

The terms used throughout this specification and the appended claims should be construed as "non-limiting" terms. For example, the terms "including" or "included" should be construed as "not being limited to an embodiment in which it is described as including". The term "has" should be construed as "not being limited to an embodiment in which it is described as having".

The terms used in this specification are used merely for convenience of description and include terms that are not used for the purpose of limiting a configuration, an operation, etc. For example, terms such as "right," "left," "up," and "down" merely indicate a direction in the drawing being referenced. In addition, the terms "inner" and "outer" merely indicate directions toward the center of an element of interest and away from the center of the element of interest, respectively. This applies similarly to terms similar to these terms and terms having the similar meanings.

The technique according to the present disclosure may be configured as follows. According to the technique of the present disclosure including the following configuration, it is possible to effectively suppress the temperature increase of the liquid crystal panel and to achieve even higher luminance and even higher definition of the display apparatus, and thereby makes it possible to form a brighter and more detailed image. In addition, it is also possible to achieve an effect of extending a lifetime of the liquid crystal panel. The effects of the technique according to the present disclosure are not necessarily limited to the effects described herein, and may be any of the effects described in the present disclosure.

(1)

A liquid crystal display apparatus including:

a liquid crystal panel;

a panel housing configured to accommodate the liquid crystal panel;

a first transparent member disposed on a front face side of the liquid crystal panel; and a frame member configured to hold the first transparent member and to be attachable to the panel housing, the frame member defining an interval between the liquid crystal panel and the first transparent member, and forming, between the liquid crystal panel and the first transparent member, a void that allows a coolant to flow along a front face of the liquid crystal panel, in which the panel housing includes an entrance flow path of the coolant formed at a first part of the panel housing, and an exit flow path of the coolant formed at a second part of the panel housing excluding the first part, and the frame member includes an introduction hole that has one end coupled to the entrance flow path and causes the entrance flow path to be communicated with the void, and a discharge hole that has one end coupled to the exit flow path and causes the exit flow path to be communicated with the void.

(2)

The liquid crystal display apparatus according to (1), further including a second transparent member disposed between the liquid crystal panel and the first transparent member, in which the frame member holds the first transparent member and the second transparent member with the first transparent member and the second transparent member being away from each other at an interval to form the void between the first and the second transparent members.

(3)

The liquid crystal display apparatus according to (2), in which the second transparent member and the liquid crystal panel are joined throughout a rear face of the second transparent member as a whole.

(4)

The liquid crystal display apparatus according to (2) or (3), in which the first transparent member has a larger size in a flow direction of the coolant in the void than the second transparent member.

(5)

The liquid crystal display apparatus according to any one of (2) to (4), in which the first transparent member has a front face that faces in the same direction as the front face of the liquid crystal panel, and a rear face on an opposite side thereof, and the front face of the first transparent member is provided at a position closer to the liquid crystal panel than a first end face, of the frame member, that faces in the same direction as the front face.

(6)

The liquid crystal display apparatus according to any one of (2) to (5), in which the second transparent member has a front face that faces in the same direction as the front face of the liquid crystal panel, and a rear face on an opposite side thereof, and the front face of the second transparent member is provided at a position closer to the liquid crystal panel than a second end face, of the frame member, that faces in the same direction as the front face.

(7)

The liquid crystal display apparatus according to any one of (1) to (6), in which the introduction hole has an open end that is close to the void and that faces in a direction perpendicular to a flow direction of the coolant in the void.

(8)

The liquid crystal display apparatus according to any one of (1) to (7), in which the discharge hole has an open end that is close to the void and that faces in a direction perpendicular to a flow direction of the coolant in the void.

(9)

The liquid crystal display apparatus according to any one of (1) to (8), in which the panel housing and the frame member are coupled to each other with the entrance flow path and the introduction hole being directly joined and with the discharge hole and the exit flow path being directly joined, and the liquid crystal display apparatus further includes:

a first sealing member that surrounds a connection end of the entrance flow path and the introduction hole throughout an entire circumference thereof; and a second sealing member that surrounds a connection end of the discharge hole and the exit flow path throughout an entire circumference thereof.

(10)

The liquid crystal display apparatus according to any one of (1) to (9), further including a widened section formed, in a flow direction of the coolant in the void, between an open end of the introduction hole and a first edge, of the liquid crystal panel, that is close to the open end, with a width of a flow path of the coolant being gradually widened.

(11)

The liquid crystal display apparatus according to (10), in which a length of the widened section in the flow direction of the coolant is ⅓ to ½ of a width of the front face of the liquid crystal panel perpendicular to the flow direction.

(12)

The liquid crystal display apparatus according to any one of (1) to (11), further including:

a first joint;

a second joint;

a first connection pipe that is coupled between the first joint and the panel housing and causes inside of the first joint to be communicated with the entrance flow path; and a second connection pipe that is coupled between the second joint and the panel housing and causes inside of the second joint to be communicated with the exit flow path, in which the first and the second joints are each disposed away from the panel housing.

(13)

The liquid crystal display apparatus according to any one of (1) to (12), further including a deaeration filter configured to remove a bubble component included in the coolant.

(14)

The liquid crystal display apparatus according to any one of (1) to (13), in which the liquid crystal panel is of a transmission type, the front face of the liquid crystal panel faces on an entrance side of light from a light source, and the void is disposed, in a light path from the light source, between the light source and the liquid crystal panel.

The present application claims the benefit of Japanese Priority Patent Application JP2020-145696 filed with the Japan Patent Office on Aug. 31, 2020, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A liquid crystal display apparatus, comprising:
a liquid crystal panel that comprises an effective screen region, wherein
the effective screen region corresponds to a first front face of the liquid crystal panel, and
the effective screen region is configured to receive incident light;
a panel housing configured to accommodate the liquid crystal panel;
a first transparent member on a side of the first front face of the liquid crystal panel;
a frame member configured to hold the first transparent member, wherein
the frame member is attachable to the panel housing,
the frame member is in between the liquid crystal panel and the first transparent member,
a void is in between the liquid crystal panel and the first transparent member,
the void allows a coolant to flow along the first front face of the liquid crystal panel,
the panel housing includes;
an entrance flow path of the coolant at a first part of the panel housing, and
an exit flow path of the coolant at a second part of the panel housing,
the frame member includes:
an introduction hole that has a first end coupled to the entrance flow path, and
a discharge hole that has a second end coupled to the exit flow path,
the entrance flow path is in communication with the void via the introduction hole, and
the exit flow path is in communication with the void via the discharge hole; and
a widened section configured to adjust at least one of a depth of the entrance flow path or a width of the entrance flow path based on the effective screen region of the liquid crystal panel.

2. The liquid crystal display apparatus according to claim 1, further comprising a second transparent member disposed between the liquid crystal panel and the first transparent member, wherein
the frame member is configured to hold the first transparent member and the second transparent member, and
the void is in between the first transparent member and the second transparent member.

3. The liquid crystal display apparatus according to claim 2, wherein the second transparent member and the liquid crystal panel are joined throughout a rear face of the second transparent member.

4. The liquid crystal display apparatus according to claim 2, wherein
a size of the first transparent member is larger than a size of the second transparent member, and
the first transparent member is in a flow direction of the coolant in the void.

5. The liquid crystal display apparatus according to claim 2, wherein the first transparent member comprises:
a second front face that faces in a first direction, and
a rear face on an opposite side of the second front face, wherein
the first direction corresponds to a direction associated with the first front face,
the second front face is at a position closer to the liquid crystal panel than a specific end face of the frame member,
the specific end face of the frame member faces in a second direction, and
the second direction corresponds to a direction associated with the second front face.

6. The liquid crystal display apparatus according to claim 2, wherein the second transparent member comprises:
a second front face that faces in a first direction; and
a rear face on an opposite side of the second front face, wherein
the first direction corresponds to a direction associated with the first front face,
the second front face is at a position closer to the liquid crystal panel than a specific end face of the frame member,
the specific end face of the frame member faces in a second direction, and
the second direction corresponds to a direction associated with the second front face.

7. The liquid crystal display apparatus according to claim 1, wherein the introduction hole faces in a direction perpendicular to a flow direction of the coolant in the void.

8. The liquid crystal display apparatus according to claim 1, wherein the discharge hole faces in a direction perpendicular to a flow direction of the coolant in the void.

9. The liquid crystal display apparatus according to claim 1, further comprises:
a first sealing member that surrounds a first connection end associated with the entrance flow path and the introduction hole; and
a second sealing member that surrounds a second connection end associated with the discharge hole and the exit flow path, wherein
the panel housing and the frame member are coupled based on the first sealing member and the second sealing member,
the entrance flow path and the introduction hole are directly joined via the first sealing member, and
the discharge hole and the exit flow path are directly joined via the second sealing member.

10. The liquid crystal display apparatus according to claim 1, wherein
the widened section is in a flow direction of the coolant in the void, and the widened section is in between an open end of the introduction hole and a first edge of the liquid crystal panel.

11. The liquid crystal display apparatus according to claim 10, wherein
a length of the widened section is ⅓ to ½ of a width of the first front face, and
the first front face is perpendicular to the flow direction of the coolant.

12. The liquid crystal display apparatus according to claim 1, further comprising:
a first joint;
a second joint;
a first connection pipe is coupled between the first joint and the panel housing, wherein the first joint is in communication with the entrance flow path via the first connection pipe; and
a second connection pipe is coupled between the second joint and the panel housing, wherein
the second joint is in communication with the exit flow path via the second connection pipe.

13. The liquid crystal display apparatus according to claim 1, further comprising a deaeration filter configured to remove a bubble component included in the coolant.

14. The liquid crystal display apparatus according to claim 1, wherein
the liquid crystal panel is a transmission type panel,
the first front face faces an entrance side of the incident light from a light source,
the void is in a direction of a light path from the light source, and
the void is in between the light source and the liquid crystal panel.

* * * * *